United States Patent [19]

Croughwell

[11] Patent Number: 5,416,691
[45] Date of Patent: May 16, 1995

[54] CHARGE PUMP CIRCUIT

[75] Inventor: Rosamaria Croughwell, Methuen, Mass.

[73] Assignee: Analog Devices, Inc., Norwood, Mass.

[21] Appl. No.: 177,589

[22] Filed: Jan. 5, 1994

[51] Int. Cl.[6] .................................................. H03L 7/00
[52] U.S. Cl. ....................................... 363/60; 307/109; 307/110
[58] Field of Search ................ 307/110, 109; 331/17, 331/25, 187, 65, 8, 111, 113 R; 328/133; 363/59-61

[56] References Cited

U.S. PATENT DOCUMENTS 4,636,748  1/1987  Latham, II ........................... 331/17
5,148,149  9/1992  Campbell et al. .................... 340/562

Primary Examiner—Steven L. Stephan
Assistant Examiner—Aditya Krishnan
Attorney, Agent, or Firm—Iandiorio & Teska

[57] ABSTRACT

An improved charge pump circuit includes a charge pump capacitor having first and second terminals for charging in first and second polarities; a current source device for supplying current selectively to the charge pump capacitor through the first and second terminals; a clamping device for defining first and second clamping voltages for the first and second terminals, respectively; a switching device for selectively connecting the current source device to one of the terminals and connecting the clamping device to the other of the terminals; and a clamp control device, responsive to the differential mode voltage across the charge pump capacitor, for setting the clamping voltages to obtain a difference between the clamping voltages equal to said differential mode voltage and pumping equal charge into the charge pump capacitor in either polarity.

6 Claims, 3 Drawing Sheets

CHARGE PUMP CIRCUIT

FIELD OF INVENTION

This invention relates to an improved single supply low voltage charge pump circuit and to such a charge pump circuit for use in a phase locked-loop application.

BACKGROUND OF INVENTION

In certain conventional phase lock loop circuits such as an AD802 PLL available from Analog Devices, Inc., used to synchronize data input with clock signals, a problem arises with respect to the symmetrical operation of the charge pump which adjusts the voltage controlled oscillator (VCO). The VCO output constitutes the clock signal which must be matched in frequency and phase to the input data signal. This is done in two steps: first with a frequency detector that detects the difference in frequency between the VCO clock output and data signal. If the VCO clock frequency is slower than the data signal the charge pump pumps up and increases the VCO output frequency. If the VCO clock frequency is faster, the charge pump pumps down and decreases the VCO output frequency. After the frequency matching or acquisition operation is done, a phase detector acts to match the phase of the data signal and clock. The charge pump combines the signals from both the phase detector and frequency detector to drive the VCO.

In single supply, low voltage systems it is desirable to have a differential charge pump. But certain of these charge pumps have inherent nonlinearity when confronted with a rapid series of alternating pump up and pump down signals such as occurs when there is jitter in the data signal. In particular the pump up and pump down signals assume unequal values resulting in a false cancellation of the corrective signals before the frequency of the data signals and VCO clock output have actually been synchronized.

SUMMARY OF INVENTION

It is therefore an object of this invention to provide an improved single supply, low voltage charge pump circuit.

It is a further object of this invention to provide such an improved charge pump circuit which pumps equal charge in either polarity.

It is a further object of this invention to provide such an improved charge pump circuit with an increased voltage output range.

It is a further object of this invention to provide such an improved charge pump circuit which tolerates much greater jitter in the input signal in phase locked-loop applications.

It is a further object of this invention to provide such an improved charge pump circuit which responds to both frequency and phase detection circuits in the phase locked-loop applications.

The invention results from the realization that a truly linear charge pump circuit capable of combining the outputs of several different detectors such as a phase and a frequency detector, can be achieved using a charge pump capacitor that is charged equally in each direction or polarity by using the differential mode voltage across the capacitor to adjust the clamping circuits which clamp the voltage at either terminal of the capacitor so that the difference between the clamping voltages is maintained equal to the differential mode voltage across the capacitor.

This invention features an improved charge pump circuit including a charge pump capacitor having first and second terminals for charging at first and second polarities. There are current source means for supplying current selectively to the charge pump capacitor through the first and second terminals. Clamping means define first and second clamp voltages for the first and second terminals, respectively. Switching means selectively connect the current source means to one of the terminals and connects the clamping means to the other of the terminals. Clamp control means, responsive to the differential mode voltage across the charge pump capacitors, set the clamping voltages to obtain a difference between the clamping voltage equal to the differential mode voltage and pumps equal charge into the charge pump capacitor in either polarity.

In a preferred embodiment the current source means may include first and second circuit current sources, the clamping means may include first and second clamping circuits, and the clamp control means may include first and second clamp control circuits. There may be common mode impedances interconnected between the first and second terminals and a datum.

The invention also features an improved phase locked-loop system including an improved charge pump circuit including a charge pump capacitor having first and second terminals for charging at first and second polarities. There are current source means for supplying current selectively to the charge pump capacitor through the first and second terminals. Clamping means define first and second clamp voltages for the first and second terminals, respectively. Switching means selectively connect the current source means to one of the terminals and connects the clamping means to the other of the terminals. Clamp control means, responsive to the differential mode voltage across the charge pump capacitors, set the clamping voltages to obtain a difference between the clamping voltage equal to the differential mode voltage and pumps equal charge into the charge pump capacitor in either polarity. There is also a frequency detector for controlling the switching means.

In a preferred embodiment the phase locked-loop system may further include a phase detector connected across the first and second terminals.

DISCLOSURE OF PREFERRED EMBODIMENT

Other objects, features and advantages will occur to those skilled in the art from the following description of a preferred embodiment and the accompanying drawings, in which.

Figure 1:
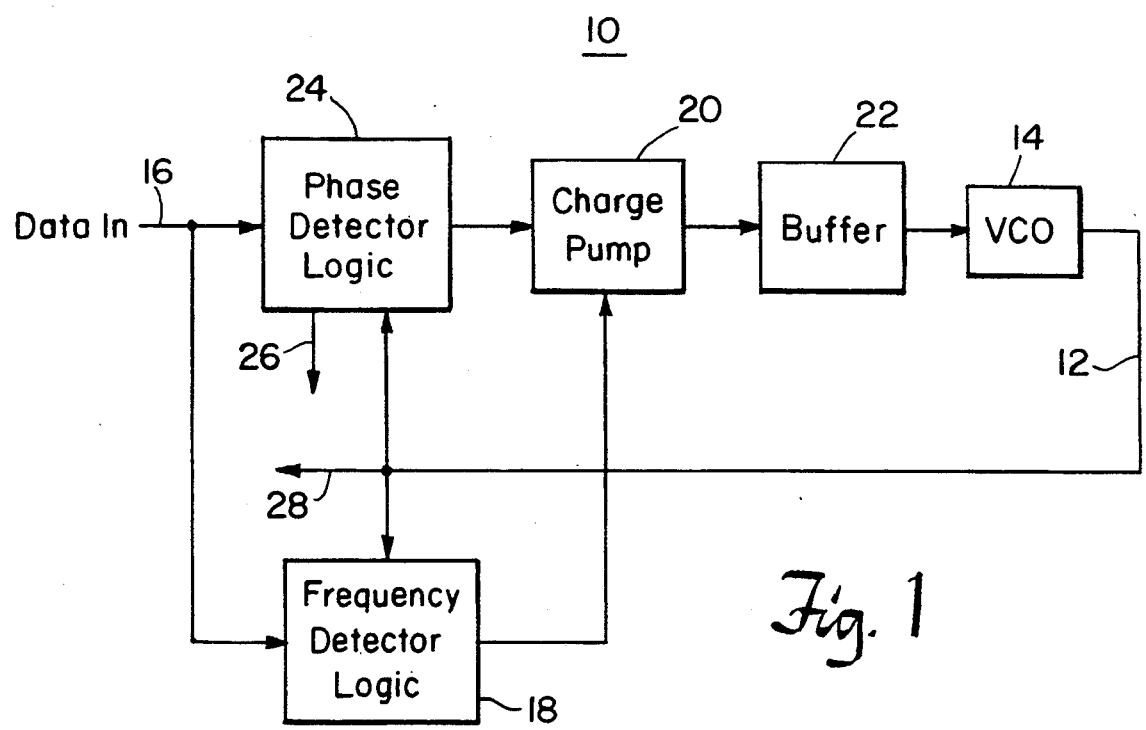
FIG. 1 is a block diagram of a phase locked-loop system using the improved charge pump circuit according to this invention.

There is shown in FIG. 1 a phase locked-loop system 10 which synchronizes the output 12 from a voltage control oscillator 14 with the data input signal at input 16. The frequency of the data input signal on line 16 and the VCO clock signal output on line 12 is compared by the frequency detector logic 18. If the input data rate or frequency is higher than that of the VCO output 12 then a pump up signal is delivered to charge pump 20. If the input data rate on line 16 is slower than the frequency of the VCO output 12 then a pump down signal is provided to charge pump 20. In either case the output from charge pump 20 is processed by buffer 22 and then provided as a voltage at the input of VCO 14 to increase or decrease the frequency of the output signal 12. Once the frequency of the VCO output 12 has been matched to that of the data input on line 16, frequency detector logic 18 becomes quiescent and phase detector logic 24 begins to operate to match the phase of VCO output 12 with the phase of the data input on line 16. The final output of the data and the clock matched as to frequency and phase are provided on lines 26 and 28, respectively.

Figure 2:
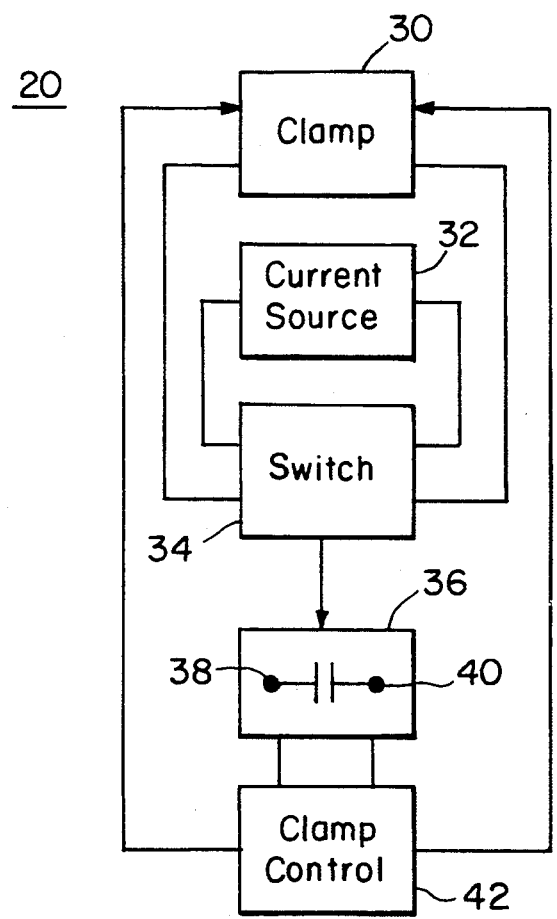
FIG. 2 is a more detailed block diagram of the charge pump circuit of FIG. 1.

Charge pump 20, FIG. 2, according to this invention includes a clamping means 30 current source 32, and switching means 34. The charge pump capacitor 36 has first and second terminals 38 and 40, respectively. Switching means 34 alternately selectively connects the clamping circuit 30 to one of terminals 38 and 40 and the current source 32 to one of the first and second terminals 38 and 40, respectively, and connects the current source 32 to the other of terminals 38 and 40. The specific level of the clamping voltage applied in each case by clamping means 30 is controlled by the clamp control circuit 42.

Figure 3:
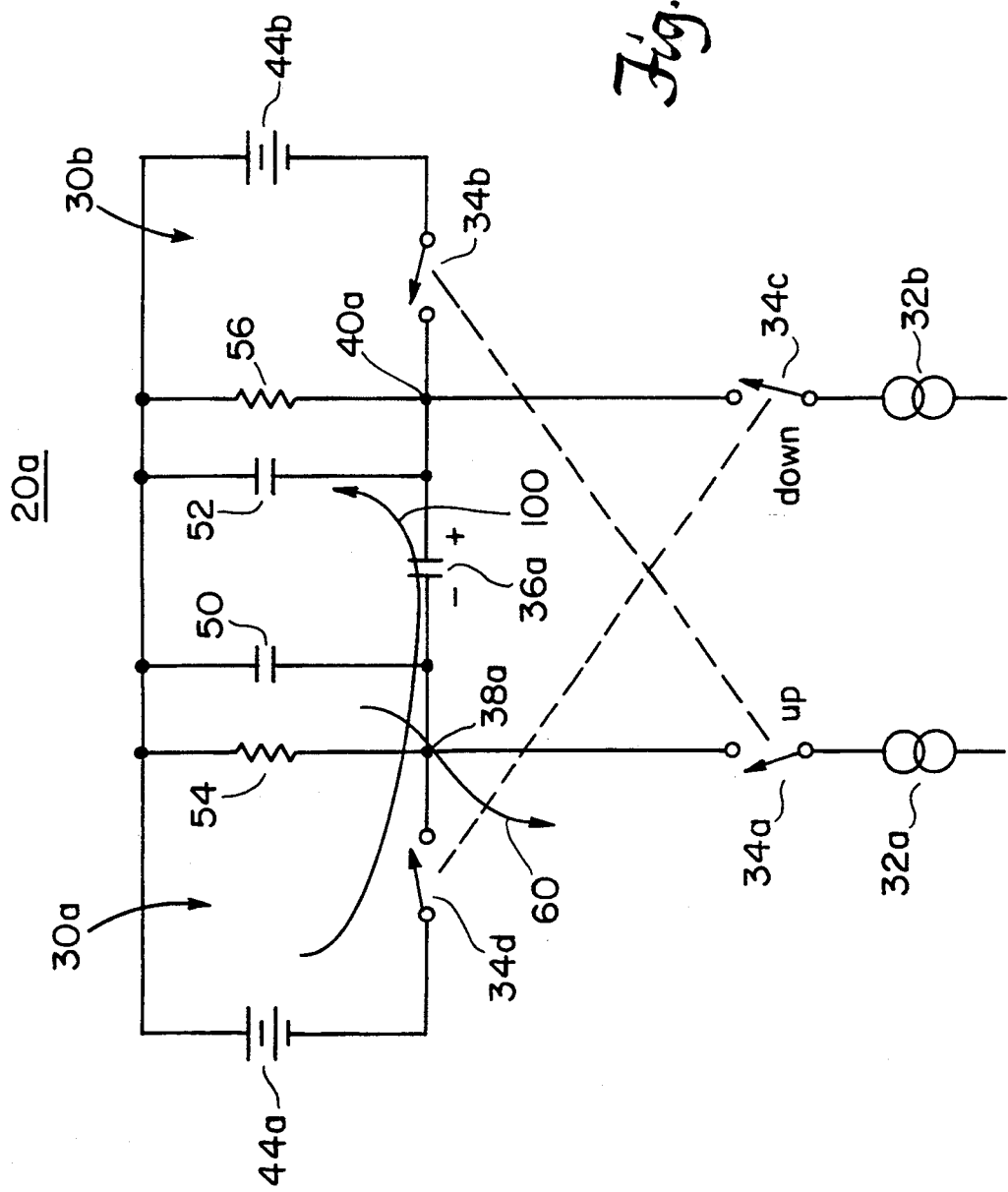
FIG. 3 is a more detailed schematic diagram of the charge pump circuit of FIG. 2.

A simplified schematic of the charge pump circuit 20a according to this invention is shown in FIG. 3, where the current source 32 actually includes two separate current sources 32a and 32b. The switching means includes four switches cross-coupled in pairs. Switches 34a and b are operated together and switches 34c and d are operated together. Clamping circuits 30a and 30b each includes a battery 44a and 44b in conjunction with their respective switches 34d and 34b. Capacitor 36a has its first and second terminals 38a and 40a interconnected with switches 34d and 34b. The frequency detector logic 18 of FIG. 1 operates all of the switches 34a, b, c and d. The output from the phase detector logic 24 is also connected across first and second terminals 38a and 40a of charge pump capacitor 36a.

In operation, as frequency detector 18 detects an over or under relationship between VCO output 12 and the data input 16, it closes the appropriate pair of switches, either 34c and d or 34a and b. If VCO output 12 is at a lower frequency than the data input rate on line 16, then for example switches 34a and 34b are closed. This causes the bias voltage from battery 44b to be provided to terminal 40a; thus current from source 32a will flow through the closed switch 34a through terminal 38a, charging capacitor 36a and continuing on through terminal 40a and closed switch 34b and into battery 44b. This puts a negative charge on terminal 38a and a positive charge on terminal 40a of capacitor 36a. Assuming that this is the direction that increases the frequency of VCO 14 then this would be the pump up switching arrangement. In that case the pump down arrangement would be to open 34a and 34b and close 34c and 34d, causing the reverse polarity to occur.

Thus in normal operation the system operates smoothly to provide the necessary pump up and pump down signals to control the increase or decrease of the VCO output 12. However, in those cases where there is common mode impedance such as parasitic or discrete capacitors 50 and 52 a problem can arise. Normally, without the presence of these common mode impedances the charging currents in both directions for capacitor 36a are equal and the system operates in a balanced fashion. But with these impedances present an imbalance occurs.

For example, if switches 34a and 34b are closed, then the potential at node 38a is determined by the sum of the voltages of clamp battery 44b and the voltage across charge pump capacitor 36a. However, if switches 34c and 34d are closed, then the potential at node 38a is simply determined by the clamp battery 44a. The two clamp batteries 44a and 44b are of the same potential. Then it is seen that the potential at node 38a changes by an amount equal to the voltage across capacitor 36a when switching between the pump up (switches 34a and 34b closed) and the pump down (switches 34c and 34d closed) conditions. If we assume a voltage on the capacitor with node 40a positive with respect to node 38a, then during the pump up condition (switches 34a and 34b closed) the potential at node 38a is more negative than during the pump down condition (switches 34c and 34d closed). Similarly, the potential at node 40a is more positive during the pump down condition (switches 34c and 34d closed) than during the pump up condition (switches 34a and 34b closed). When switching from the pump down condition (switches 34c and 34d closed) to the pump up condition (switches 34a and 34b closed) the potential across common mode capacitor 50 increases. This increase in potential represents a charge placed on capacitor 50 by a current flow indicated by arrow 60 in FIG. 3. This charge was intended to go on to capacitor 36a, and thus represents a weakening of the pump up effect. Further, when switching from the pump up condition (switches 34a and 34b closed) to the pump clown condition (switches 34c and 34d closed) the potential across common mode capacitor 52 decreases. This decrease in potential represents a charge placed on time capacitor 52 by a current flow indicated by arrow 100 in FIG. 3. Note this current flows through capacitor 36a and thus represents extra charge placed on capacitor 36a, and thus represents a strengthening of the pump Down effect. Similarly, if the voltage across the capacitor 36a is of opposite polarity to that shown in FIG. 3, then the pump up effect will be strengthened and the pump down effect will be weakened.

This is a particular problem when there is jitter in the data input signal on line 16. In that case the difference in the frequency of the data input signal 16 and VCO output signal 12 may be falsely indicated by the jitter to be changing back and forth so that in one instant the data input signal seems to be of a higher (or lower) frequency and in the next instant the VCO output 12 seems to be of a higher (or lower) frequency. In any case, the cumulative effect of the system repeatedly, rapidly attempting to compensate for the discrepancies first in one direction and then the other causes a buildup of the error introduced by the impedances 50–56 which will mislead the system as a whole into thinking that the frequencies have been matched when in fact they have not.

In accordance with this invention in order to overcome that problem the voltage across capacitor 36a at terminals 38a and 40a is sensed and fed back to adjust the clamp voltages provided by battery 44a and 44b so that the difference between the two clamp voltages is the same as the differential voltage across capacitor 36a.

If the difference between the two clamp voltages is the same as the differential voltage across capacitor 36a, then the potentials at nodes 38a and 40a do not change when switching between the pump up and pump down conditions. This eliminates the two error charges previously described, one which weakens and one which strengthens the pump up and pump down. Thus the charge pump is rendered linear in its response with pump up and pump down effects always equal to each other.

Figure 4:
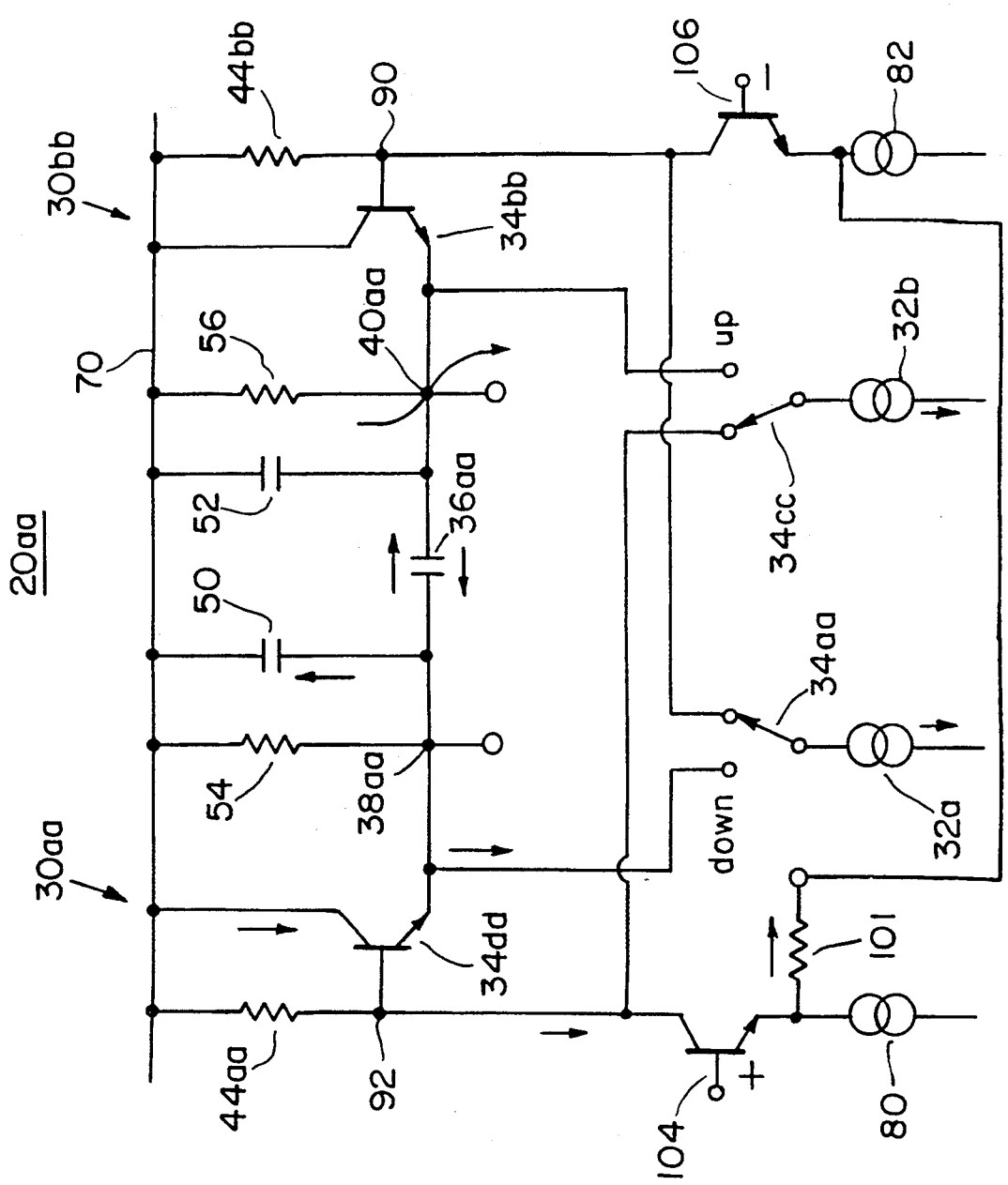
FIG. 4 is an even more detailed schematic of a charge pump circuit according to this invention.

In one specific implementation of the invention, as shown in FIG. 4, a single supply low voltage is supplied on ground or datum line 70. In this embodiment battery 44a and switch 34d are replaced and their functions performed by resistance 44aa and transistor 34dd, respectively and current source 80. In clamping circuit 30bb resistor 44bb and current source 82, replaces battery 44b and transistor 34bb replaces the function of switch 34b. Current sources 32a and 32b are essentially the same in FIG. 4 as in FIG. 3. The provision of the clamp voltages is completed by current sources 80 and 82 in conjunction with respective resistors 44aa and 44bb. With the position of switch 34aa as shown in FIG. 4, point 90 is pulled low and transistor 34bb is cut off, similar to switch 34b being in the open position. Similarly, with the position of switch 34cc as shown in FIG. 4, the point 92 is drawn low, cutting off transistor 34dd similar to switch 34d being in the open position. This is the quiescent state of frequency detector 18, FIG. 1. If now switch 34aa is thrown to the other position, point 90 is allowed to rise, transistor 34bb conducts, and the current passes through capacitor 36aa from terminal 40aa to terminal 38aa. Conversely, if switch 34cc is thrown to the other position as shown in FIG. 4, transistor 34dd conducts and capacitor 36aa is charged in the other polarity or direction from 38aa to 40aa.

In keeping with this invention, in order to prevent an imbalance in the charging of capacitor 36aa in the opposite polarity directions, a clamping control circuit implemented by resistor 101 interconnected between sources 80 and 82 and a pair of cascode transistors 104 and 106 are used to adjust the current flow from sources 80 and 82, respectively, and bases of CASCODEs 104 and 106 are driven by means responsive to the voltages at nodes 38aa and 40aa. Thus the voltages on base terminals 90 and 92, respectively, of transistors 34dd and 34bb: the difference between these clamping voltages is equal to the differential voltage across terminals 38aa and 40aa of capacitor 36aa. In this way, as before, the current flow in both charging polarities or directions is kept equal, and even though extreme jitter may occur, the system will accurately match the frequency of VCO output 12 with the frequency of data input signal 16.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. An improved linear charge pump circuit comprising:
   a charge pump capacitor having first and second terminals for charging in first and second polarities;
   first and second current source means for supplying current selectively to said charge pump capacitor through said first and second terminals;
   clamping means for defining first and second clamping voltages for said first and second terminals, respectively;
   switching means for selectively connecting said current source means to one of said terminals and connecting said clamping means to the other of said terminals; and
   clamp control means, responsive to the differential mode voltage across said charge pump capacitor, for setting the clamping voltages to obtain a difference between the clamping voltages equal to said differential mode voltage and pumping equal charge into said charge pump capacitor in either said first or second polarity.

2. The improved linear charge pump circuit of claim 1 in which said clamping means includes first and second clamping circuits.

3. The improved linear charge pump circuit of claim 1 further including common mode impedances interconnected between said first and second terminals and datum.

4. An improved phase lock loop system comprising:
   a charge pump capacitor having first and second terminals for charging in first and second polarities;
   first and second current source means for supplying current selectively to said charge pump capacitor through said first and second terminals;
   clamping means for defining first and second clamping voltages for said first and second terminals, respectively;
   switching means for selectively connecting said current source means to one of said terminals and connecting said clamping means to the other of said terminals;
   clamp control means, responsive to the differential mode voltage across said charge pump capacitor, for setting the clamping voltages to obtain a difference between the clamping voltages equal to said differential mode voltage and for pumping equal charge into said charge pump capacitor in either said first or second polarity; and
   a frequency detector for controlling said switching means.

5. The improved phase lock loop system of claim 4 further including a phase detector connected across said first and second terminals.

6. An improved linear charge pump circuit comprising:
   a charge pump capacitor having first and second terminals for charging in first and second polarities;
   current source means for supplying current selectively to said charge pump capacitor through said first and second terminals;
   first and second clamping means for defining first and second clamping voltages for said first and second terminals, respectively;
   switching means for selectively connecting said current source means to one of said terminals and connecting said clamping means to the other of said terminals; and
   first and second clamp control means, responsive to the differential mode voltage across said charge pump capacitor, for setting the clamping voltages to obtain a difference between the clamping voltages equal to said differential mode voltage and pumping equal charge into said charge pump capacitor in either said first or second polarity.

* * * * *